US007002503B2

(12) United States Patent
Lee

(10) Patent No.: US 7,002,503 B2
(45) **Date of Patent: *Feb. 21, 2006**

(54) HIGH SPEED ENCODER FOR HIGH SPEED ANALOG-TO-DIGITAL CONVERTER

(75) Inventor: Ho-Young Lee, Seongnam (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 10/977,954

(22) Filed: Oct. 29, 2004

(65) Prior Publication Data

US 2005/0062634 A1 Mar. 24, 2005

Related U.S. Application Data

(63) Continuation-in-part of application No. 10/436,318, filed on May 12, 2003, now Pat. No. 6,919,836.

(30) Foreign Application Priority Data

Aug. 7, 2002 (KR) ............................... 2002-46572

(51) Int. Cl.
*H03M 1/36* (2006.01)

(52) U.S. Cl. ....................................... 341/160; 341/155

(58) Field of Classification Search ................ 341/160, 341/155, 172

See application file for complete search history.

*Primary Examiner*—Peguy JeanPierre

(74) *Attorney, Agent, or Firm*—F.Chau & Associates, LLC

(57) ABSTRACT

A binary encoder which has a fast conversion speed, occupies a small area, and consumes a small amount of power is provided. The binary encoder includes first and second latch transistors, first and second charge transistors, first and second control transistors, first and second discharge transistors, an equalize transistor, and first and second inverters. The first charge transistor charges a first output node to a level of a power voltage in response to a clock signal. The second charge transistor charges a second output node to the level of the power voltage in response to the clock signal. The first discharge transistor discharges a first control node to a level of a ground voltage in response to a first input signal. The second discharge transistor discharges a second control node to the level of the ground voltage in response to a second input signal.

20 Claims, 3 Drawing Sheets

HIGH SPEED ENCODER FOR HIGH SPEED ANALOG-TO-DIGITAL CONVERTER

This application is a Continuation-In-Part of U.S. application Ser. No. 10/436,318 filed May 12, 2003 is now a U.S. Pat. No. 6,919,836, which claims priority to Korean Patent Application No. 2002-46572 filed on Aug. 7, 2002 in the Korean Intellectual Property Office. The disclosure of the copending U.S. application Ser. No. 10/436,318 is incorporated-by-reference herein.

BACKGROUND OF THE INVENTION

1. Field of the Invention

The present invention relates generally to a high-speed encoder, and more particularly, to a high-speed encoder used in an analog-to-digital converter.

2. Description of the Related Art

Analog-to-digital (A/D) converters are circuits, which convert an analog signal to a digital signal. With an increase in demand for mixed-mode systems such as household electrical appliances, the need for A/D converters has also increased. Consequently, manufacturers of systems requiring a high-speed operation, such as a digital video disc (DVD) player, a direct broadcasting for satellite (DBS) receiver, other communication application products, or the like, desire a technique for making an A/D converter into a chip using a CMOS process to keep manufacturing costs low. Due to this desire for low cost CMOS processing, a technique for directly processing a radio frequency (RF) signal raises additional issues. For example, a CMOS A/D converter for processing a high-speed signal such as the RF signal must be capable of a conversion speed of 1 giga sample per second (GSPS) or more and have the characteristics of a medium resolution.

A full-flash A/D converter is suitable for a high-speed operation in a range of GHz. A conventional full-flash A/D converter includes a comparator array, which converts an analog signal into a digital code referred to as a thermometer code, a NAND array, which converts the thermometer code into a 1-of-n code, and a binary encoder block, which converts the 1-of-n code into a final binary code.

Various implementations of realizing the binary encoder block include an implementation using a logic tree and an implementation using a ROM structure. In the implementation using the logic tree, a large amount of power is consumed and timing errors can easily occur. For example, in the event that the binary encoder block is realized using a 2-input logic circuit, 69 logic circuits are needed to make 1 bit of the final binary code. Also, the propagation of the numerous stages of logic circuits causes delays in transmitting a synchronous signal. As a result, an additional circuit, such as a flip-flop or the like, is required.

On the other hand, an encoder using a ROM structure occupies a smaller area and consumes a smaller amount of power. There is also less occurrences of timing errors. Thus, the encoder using a ROM is generally used in applications requiring a conversion speed of 100 MHz or higher. However, for a conversion speed of 1 GHz, it is difficult for an encoder using the ROM structure to convert a signal within 1 cycle.

A need therefore exists for a binary encoder, which occupies a small area and uses a small amount of power, and is capable of a fast conversion speed of several tens or more of GHz.

SUMMARY OF THE INVENTION

According to an aspect of the present invention, there is provided a binary encoder comprising a first latch transistor that is connected between a node of a first reference voltage and a first output node and responds to a signal output from a second output node; a second latch transistor that is connected between the node of the first reference voltage and the second output node and responds to a signal output from the first output node; an equalize transistor that equalizes a level of the first output node and a level of the second output node in response to a clock signal; a first control transistor that is connected between the first output node and a first control node and responds to the clock signal; a second control transistor that is connected between the second output node and a second control node and responds to the clock signal; a first discharge transistor that discharges the first control node to a level of a second reference voltage in response to a first input signal; and a second discharge transistor that discharges the second control node to the level of the second reference voltage in response to a second input signal.

In at least one embodiment, the first and second latch transistors and the first and second charge transistors are PMOS transistors. The equalize transistor is a PMOS transistor. The first and second control transistors and the first and second discharge transistors are NMOS transistors. The first reference voltage is a power voltage. The second reference voltage is a ground voltage.

BRIEF DESCRIPTION OF THE DRAWINGS

The above aspects, features and advantages of the present invention will become more apparent by describing in detail exemplary embodiments thereof with reference to the attached drawings in which.

DETAILED DESCRIPTION OF PREFERRED EMBODIMENTS

Figure 1:
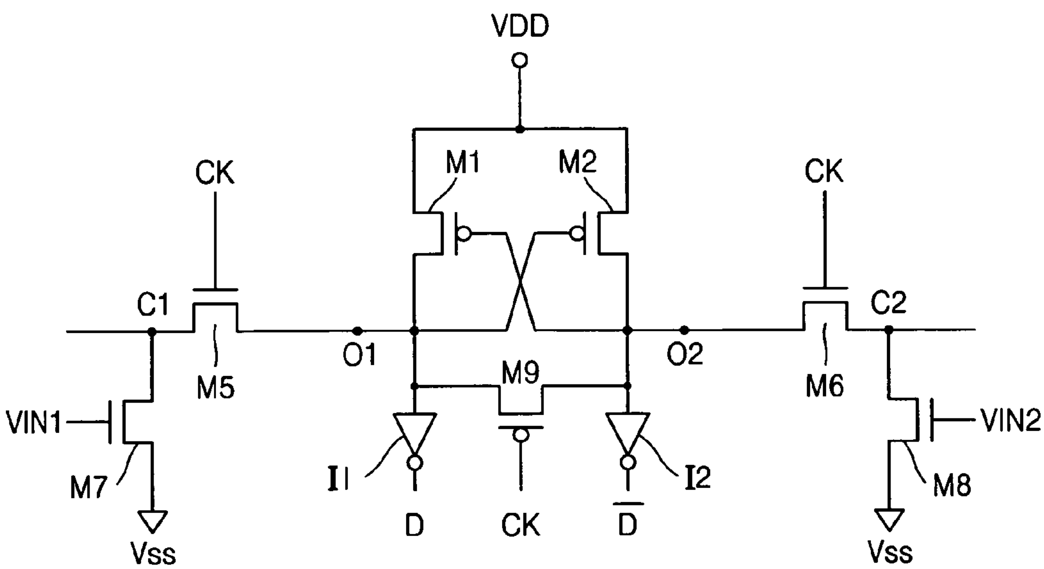
FIG. 1 is a circuit diagram of a 1-bit binary encoder according to an embodiment of the present invention.

Hereinafter, the present invention will be described in detail by explaining preferred embodiments thereof with reference to the attached drawings. Like reference numerals in the drawings denote like elements.

FIG. 1 is a circuit diagram of a 1-bit binary encoder according to an embodiment of the present invention. Referring to FIG. 1, the 1-bit binary encoder includes a first latch transistor M1, a second latch transistor M2, a first control transistor M5, a second control transistor M6, a first discharge transistor M7, a second discharge transistor M8, an equalize transistor M9, and first and second inverters I1 and I2.

The first latch transistor M1, the second latch transistor M2 are PMOS transistors. The first control transistor M5, the second control transistor M6, the first discharge transistor M7, and the second discharge transistor M8 are NMOS transistors. The equalize transistor M9 is a PMOS transistor.

The first latch transistor M1 is connected between a first reference voltage node, e.g., a power voltage node VDD, and a first output node 01 and is controlled by a signal output from a second output node 02. The second latch transistor M2 is connected between the first reference voltage node and the second output node 02 and is controlled by a signal output from the first output node 01.

The first control transistor M5 is connected between the first output node 01 and a first control node C1 and is controlled by the clock signal CK. The second control transistor M6 is connected between the second output node 02 and a second control node C2 and is controlled by the clock signal CK.

The first discharge transistor M7 is connected between the first control node C1 and a node of a second reference voltage, e.g., a node of a ground voltage VSS, and is controlled by a first input signal VIN1. The first discharge transistor M7 discharges the first control node C1 to a level of the ground voltage VSS in response to the first input signal VIN1. The second discharge transistor M8 is connected between the second control node C2 and the node of the ground voltage VSS and is controlled by a second input signal VIN2. The second discharge transistor M8 discharges the second control node C2 to the level of the ground voltage VSS in response to the second input signal VIN2.

The inverter I1 inverts a signal output from the first output node 01 and outputs a final binary code of 1 bit D. The inverter I2 inverts a signal output from the second output node 02 and outputs a complementary signal /D of the final binary code of 1 bit D.

The equalize transistor M9 is connected between the first output node 01 and the second output node 02. The gate of the equalize transistor M9 is connected to clock signal CK. Upon activation of the equalize transistor M9 at low clock level of CK, the first output node 01 is equalized to the second output node 02.

Figure 2:
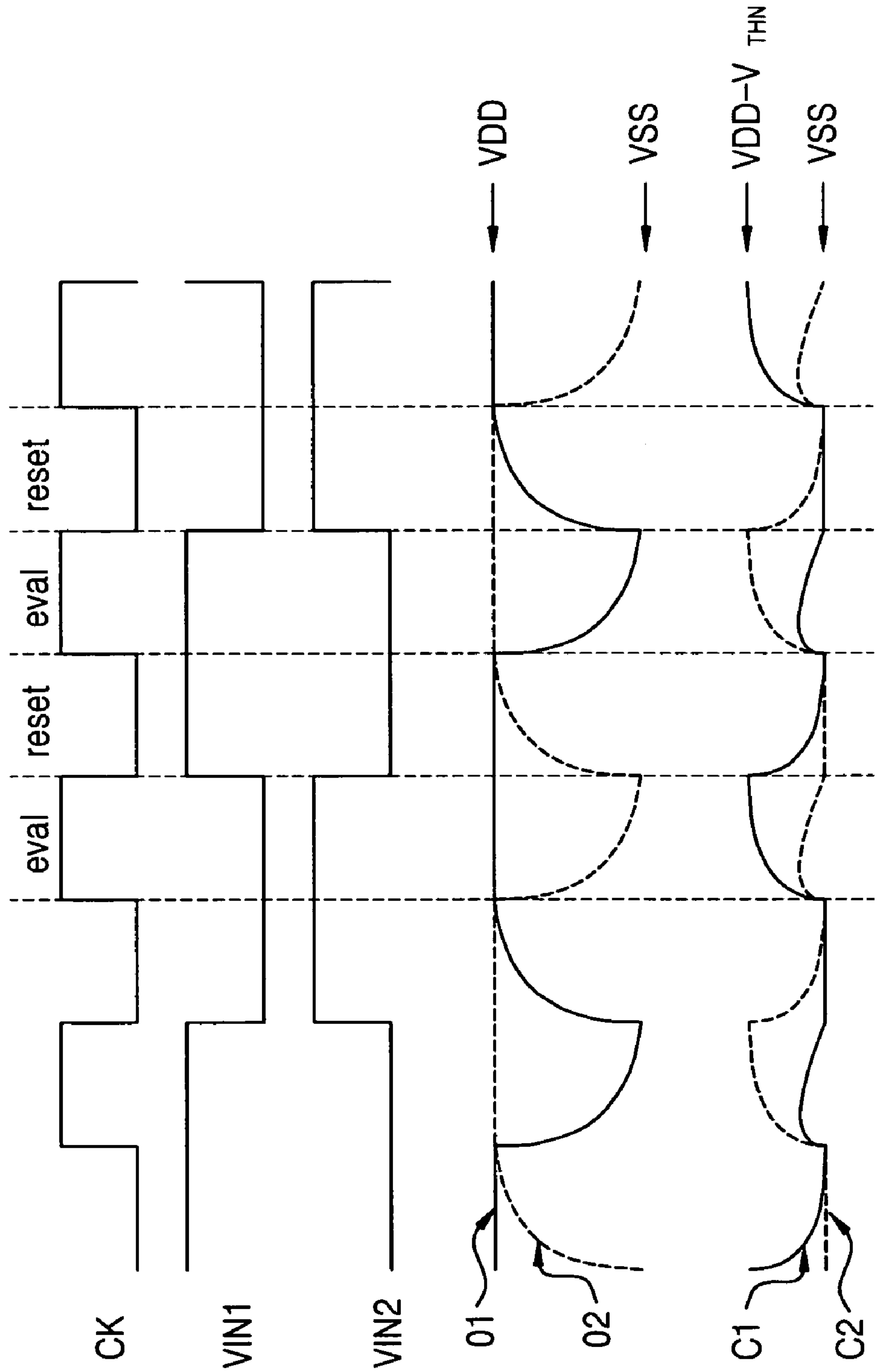
FIG. 2 is a timing diagram illustrating the operation of the 1-bit binary encoder shown in FIG. 1, according to an embodiment of the present invention.

FIG. 2 is a timing diagram illustrating the operation of the 1-bit binary encoder shown in FIG. 1, according to an embodiment of the present invention. Hereinafter, the operation of the 1-bit binary encoder will be described in detail with reference to FIG. 2.

If the clock signal CK is logic "low", the equalize transistor M9 is turned on, and thus the first and second output nodes 01 and 02 are equalized, e.g., they reach the same voltage level Here, the first and second control transistors M5 and M6 are turned off.

If the first input signal VIN1 is logic "high" and the second input signal VIN2 is logic "low", the first discharge transistor M7 is turned on, and thus the first control node C1 is discharged to the level of the ground voltage VSS. Also, the second discharge transistor M8 is turned off, and thus the second control node C2 maintains its existing state.

In contrast, if the first input signal VIN1 is logic "low" and the second input signal VIN2 is logic "high", the first discharge transistor M7 is turned off, and thus the first control node C1 maintains its existing state. Also, the second discharge transistor M8 is turned on, and thus the second control node C2 is discharged to the level of the ground voltage VSS.

If the clock signal CK is logic "high", the equalize transistor M9 is turned off while the first and second control transistors M5 and M6 are turned on. Thus, in this case, the first and second output nodes 01 and 02 are converted to logic "high" or "low" due to a positive feedback operation depending on the states of the first and second input signals VIN1 and VIN2.

If the first output node 01 is maintained in a logic "high" state, the second output node 02 is logic "low". Thus, the logic "high" state of the first output node 01 can be stably maintained. Here, the first control node C1 increases only to a value obtained by subtracting a threshold voltage $V_{THN}$ of the first control transistor M5, e.g., an NMOS transistor, from the level of the power voltage VDD. Thus, the speed of the first control node C1 increases.

If the first output node 01 is logic "low", the first control node C1 is initialized to the level of the ground voltage VSS, i.e., a load capacitor (not shown) connected to the first control node C1 is not charged. Thus, the first output node 01 is discharged at a fast speed.

Since the 1-bit binary encoder according to an embodiment of the present invention has output nodes of a differential structure, a conversion speed and accuracy greatly increase compared with the speed provided by the output nodes of a single structure.

Table 1 below shows 1-bit binary encoding representing an operation of the 1-bit binary encoder shown in FIG. 1.

TABLE 1

| VIN1 | VIN2 | D |
|---|---|---|
| 1 | 0 | 1 |
| 0 | 1 | 0 |

Figure 3:
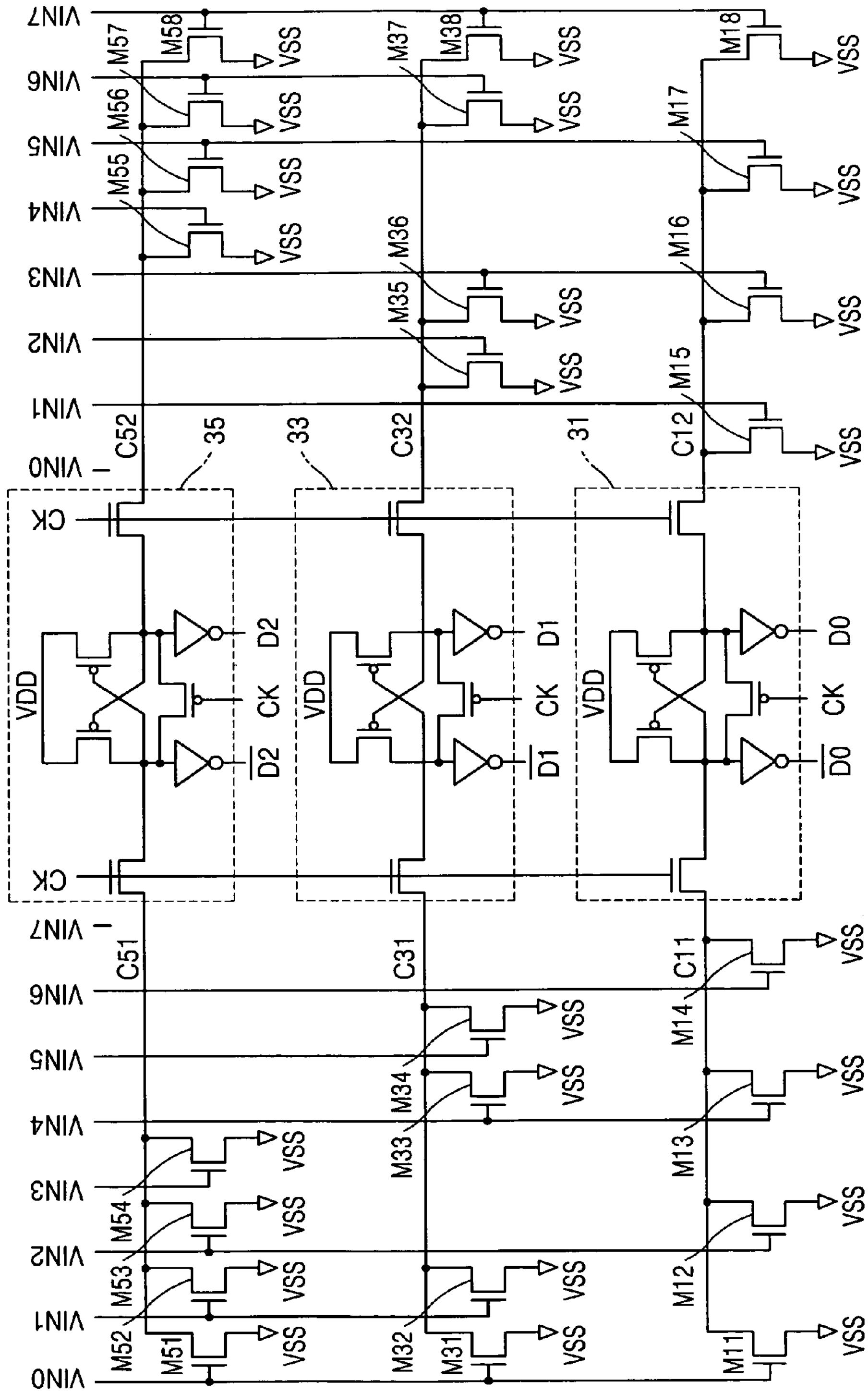
FIG. 3 is a circuit diagram of a 3-bit binary encoder according to another embodiment of the present invention.

FIG. 3 is a circuit diagram of a 3-bit binary encoder according to another embodiment of the present invention. Referring to FIG. 3, the 3-bit binary encoder includes first, second and third 1-bit binary encoder cells 31, 33, and 35 and discharge transistors M11 through M18, M31 through M38, and M51 through M58.

The 1-bit binary encoder cells 31, 33, and 35 are the same as those shown in FIG. 1. The discharge transistors M11 through M14 are connected to a first control node C11 of the first 1-bit binary encoder cell 31 and the discharge transistors M15 through M18 are connected to a second control node C12 of the first 1-bit binary encoder cell 31. The discharge transistors M31 through 34 are connected to a first control node C31 of the second 1-bit binary encoder cell 33 and the discharge transistors M35 through M38 are connected to a second control node C32 of the second 1-bit binary encoder cell 33. The discharge transistors M51 through M54 are connected to a first control node C51 of the third 1-bit binary encoder cell 35 and the discharge transistors M55 through M58 are connected to a second control node C52 of the 1-bit binary encoder cell 35.

Table 2 below shows 3-bit binary encoding representing an operation of the 3-bit binary encoder shown in FIG. 3.

TABLE 2

| | 1-of-n code (VIN[7:0]) | | | | | | | | Binary code (D[2:0]) | | |
|---|---|---|---|---|---|---|---|---|---|---|---|
| | VIN7 | VIN6 | VIN5 | VIN4 | VIN3 | VIN2 | VIN1 | VIN0 | D2 | D1 | D0 |
| 7 | 1 | 0 | 0 | 0 | 0 | 0 | 0 | 0 | 1 | 1 | 1 |
| 6 | 0 | 1 | 0 | 0 | 0 | 0 | 0 | 0 | 1 | 1 | 0 |
| 5 | 0 | 0 | 1 | 0 | 0 | 0 | 0 | 0 | 1 | 0 | 1 |
| 4 | 0 | 0 | 0 | 1 | 0 | 0 | 0 | 0 | 1 | 0 | 0 |

TABLE 2-continued

| | 1-of-n code (VIN[7:0]) | | | | | | | | Binary code (D[2:0]) | | |
|---|---|---|---|---|---|---|---|---|---|---|---|
| | VIN7 | VIN6 | VIN5 | VIN4 | VIN3 | VIN2 | VIN1 | VIN0 | D2 | D1 | D0 |
| 3 | 0 | 0 | 0 | 0 | 1 | 0 | 0 | 0 | 0 | 1 | 1 |
| 2 | 0 | 0 | 0 | 0 | 0 | 1 | 0 | 0 | 0 | 1 | 0 |
| 1 | 0 | 0 | 0 | 0 | 0 | 0 | 1 | 0 | 0 | 0 | 1 |
| 0 | 0 | 0 | 0 | 0 | 0 | 0 | 0 | 1 | 0 | 0 | 0 |

For example, when input signals (VIN[7:0]) are 00001000, the discharge transistors M16, M36, and M54 of the discharge transistors M11 through M18, M31 through M38, and M51 through M58 are turned on and the other transistors are turned off. Thus, the second control nodes C12 and C32 of the first and second 1-bit binary encoder cells 31 and 33 and the first control node C51 of the third 1-bit binary encoder cell 35 are logic "low" and the first control nodes C11 and C31 of the first and second 1-bit binary encoder cells 31 and 33 and the second control node C52 of the third 1-bit binary encoder cell 35 are maintained in an initial state, e.g., at the logic "high" level. Thus, when the clock signal CK is logic "high", output signals, e.g., the final binary codes (D[2:0]) are 011.

The 3-bit binary encoder constituted by using the 1-bit binary encoder shown in FIG. 1 is shown in FIG. 3. However, the 3-bit binary encoder may expand to a 4 bits or more binary encoder.

As described above, a binary encoder according to the present invention has a fast operational speed, e.g., a fast conversion speed. Also, the binary encoder can be constituted to a structure similar to a ROM structure. Thus, the binary encoder can occupy a small area and consume a small amount of power, similar to an encoder using a ROM structure.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A binary encoder comprising:

a first latch transistor that is connected between a node of a first reference voltage and a first output node and responds to a signal output from a second output node;

a second latch transistor that is connected between the node of the first reference voltage and the second output node and responds to a signal output from the first output node;

an equalize transistor that equalizes a level of the first output node and a level of the second output node in response to a clock signal;

a first control transistor that is connected between the first output node and a first control node and responds to the clock signal;

a second control transistor that is connected between the second output node and a second control node and responds to the clock signal;

a first discharge transistor that discharges the first control node to a level of a second reference voltage in response to a first input signal; and a second discharge transistor that discharges the second control node to the level of the second reference voltage in response to a second input signal.

2. The binary encoder of claim 1, wherein the first and second latch transistors are PMOS transistors.

3. The binary encoder of claim 1, wherein the equalize transistor is a PMOS transistor.

4. The binary encoder of claim 1, wherein the first and second control transistors are NMOS transistors.

5. The binary encoder of claim 1, wherein the first and second discharge transistors are NMOS transistors.

6. The binary encoder of claim 1, wherein the first reference voltage is a power voltage.

7. The binary encoder of claim 1, wherein the second reference voltage is a ground voltage.

8. The binary encoder of claim 1, further comprising a first inverter for inverting an output signal from the first output node and outputting a binary code.

9. The binary encoder of claim 8, further comprising a second inverter for inverting an output signal from the second output node and outputting a complementary signal of the binary code.

10. A binary encoder comprising:

a first output node and a second output node;

a node of a first reference voltage and a node of second reference voltage;

a first transistor that is connected between the node of the first reference voltage and the first output node and controlled by a signal output from the second output node;

a second transistor that is connected between the node of the first reference voltage and the second output node and controlled by a signal output from the first output node;

an equalize transistor that is connected between the first output node and the second output node and controlled by a clock signal;

a first control node and a second control node;

a third transistor that is connected between the first control node and the first output node and controlled by a clock signal;

a fourth transistor that is connected between the second control node and the second output node and controlled by the clock signal;

a fifth transistor that is connected between the first control node and the node of the second reference voltage and controlled by a first input signal; and a sixth transistor that is connected between the second control node and the node of the second reference voltage and controlled by a second input signal.

11. The binary encoder of claim 10, wherein the first and second transistors are PMOS transistors.

12. The binary encoder of claim 10, wherein the third through fifth transistors are NMOS transistors.

13. The binary encoder of claim 10, wherein the first reference voltage is a power voltage.

14. The binary encoder of claim 10, wherein the second reference voltage is a ground voltage.

15. The binary encoder of claim 10, further comprising a first inverter for inverting an output signal from the first output node and outputting a binary code.

16. The binary encoder of claim 15, further comprising a second inverter for inverting an output signal from the second output node and outputting a complementary signal of the binary code.

17. A binary encoder comprising:

an equalizing means for equalizing a level of a first output node and a level of a second output node in response to a clock signal;

a first control means for controlling a first control node in response to the clock signal;

a second control means for controlling a second control node in response to the clock signal;

a first discharging means for discharging the first control node to a level of a second reference voltage in response to a first input signal; and a second discharging means for discharging the second control node to the level of the second reference voltage in response to a second input signal.

18. The binary encoder of claim 17, further comprising:

a first latching means for latching the first output node to a level of a first reference voltage in response to a signal output from the second output node; and a second latching means for latching the second output node to the level of the first reference voltage in response to a signal output from the first output node.

19. The binary encoder of claim 18, wherein the first reference voltage is a power voltage.

20. The binary encoder of claim 17, wherein the second reference voltage is a ground voltage.

* * * * *